US007311520B2

(12) United States Patent
Saito et al.

(10) Patent No.: US 7,311,520 B2
(45) Date of Patent: Dec. 25, 2007

(54) HEAT TREATMENT APPARATUS

(75) Inventors: Takanori Saito, Tokyo-To (JP); Kenichi Yamaga, Tokyo-To (JP); Ken Nakao, Tokyo-To (JP)

(73) Assignee: Tokyo Electron Limited, Tokyo (JP)

( * ) Notice: Subject to any disclaimer, the term of this patent is extended or adjusted under 35 U.S.C. 154(b) by 326 days.

(21) Appl. No.: 10/528,704

(22) PCT Filed: Aug. 29, 2003

(86) PCT No.: PCT/JP03/11100

§ 371 (c)(1), (2), (4) Date: Mar. 22, 2005

(87) PCT Pub. No.: WO2004/030061

PCT Pub. Date: Apr. 8, 2004

(65) Prior Publication Data

US 2006/0021582 A1    Feb. 2, 2006

(30) Foreign Application Priority Data

Sep. 24, 2002   (JP) .............................. 2002-278046

(51) Int. Cl.
*F27D 11/00* (2006.01)
(52) U.S. Cl. ..................... 432/247; 219/390; 118/725
(58) Field of Classification Search ............... 432/239, 432/241, 247; 219/209, 390; 392/416; 438/660, 438/663; 118/50.1, 715, 724, 725
See application file for complete search history.

(56) References Cited

U.S. PATENT DOCUMENTS 4,989,540 A * 2/1991 Fuse et al. ............... 118/719

5,903,711 A * 5/1999 Okase ...................... 392/418

(Continued)

FOREIGN PATENT DOCUMENTS

JP         5-166739         7/1993

(Continued)

OTHER PUBLICATIONS

International Preliminary Examination Report (PCT/IPEA/409) (translated) issued for PCT/JP2003/011100.

(Continued)

*Primary Examiner*—Gregory Wilson
(74) *Attorney, Agent, or Firm*—Smith, Gambrell & Russell, LLP

(57) ABSTRACT

The present invention is a thermal processing unit including: a heating-furnace body whose upper end has an opening; a reaction tube consisting of a single tube contained in the heating-furnace body; a gas-discharging-unit connecting portion formed at an upper portion of the reaction tube, the gas-discharging-unit connecting portion having a narrow diameter; a substrate-to-be-processed supporting member for supporting a substrate to be processed, contained in the heating-furnace body; and a heating unit for heating the substrate to be processed supported by the substrate-to-be-processed supporting member. The heating unit has: a first heating portion arranged around the reaction tube, a second heating portion arranged around the gas-discharging-unit connecting portion, a third heating portion arranged around an upper portion of the reaction tube, a fourth heating portion arranged around a lower portion of the reaction tube, and a fifth heating portion arranged under the substrate-to-be-processed supporting member.

22 Claims, 10 Drawing Sheets

U.S. PATENT DOCUMENTS

| | | | |
|---|---|---|---|
| 6,187,102 B1 * | 2/2001 | Yamamoto | 118/725 |
| 6,407,367 B1 * | 6/2002 | Ito et al. | 219/390 |
| 6,730,885 B2 * | 5/2004 | Suzuki et al. | 219/486 |
| 6,736,636 B2 * | 5/2004 | Saito | 432/239 |
| 2001/0054386 A1 | 12/2001 | Saito | |
| 2002/0014483 A1 | 2/2002 | Suzuki et al. | |
| 2002/0055080 A1 | 5/2002 | Tanaka et al. | |

FOREIGN PATENT DOCUMENTS

| | | |
|---|---|---|
| JP | 6-196427 | 7/1994 |
| JP | 2001-148350 | 5/2001 |
| JP | 2001-156005 | 6/2001 |
| JP | 2001-210631 | 8/2001 |
| JP | 2002-009009 | 1/2002 |
| JP | 2002-43226 | 2/2002 |
| JP | 2002-164298 | 6/2002 |
| JP | 2002-175123 | 6/2002 |
| JP | 2002-208591 | 7/2002 |

OTHER PUBLICATIONS

Notification of Transmittal of Copies of Translation of the International Preliminary Examination Report (PCT/IB/338) issued for PCT/JP2003/011100.

* cited by examiner

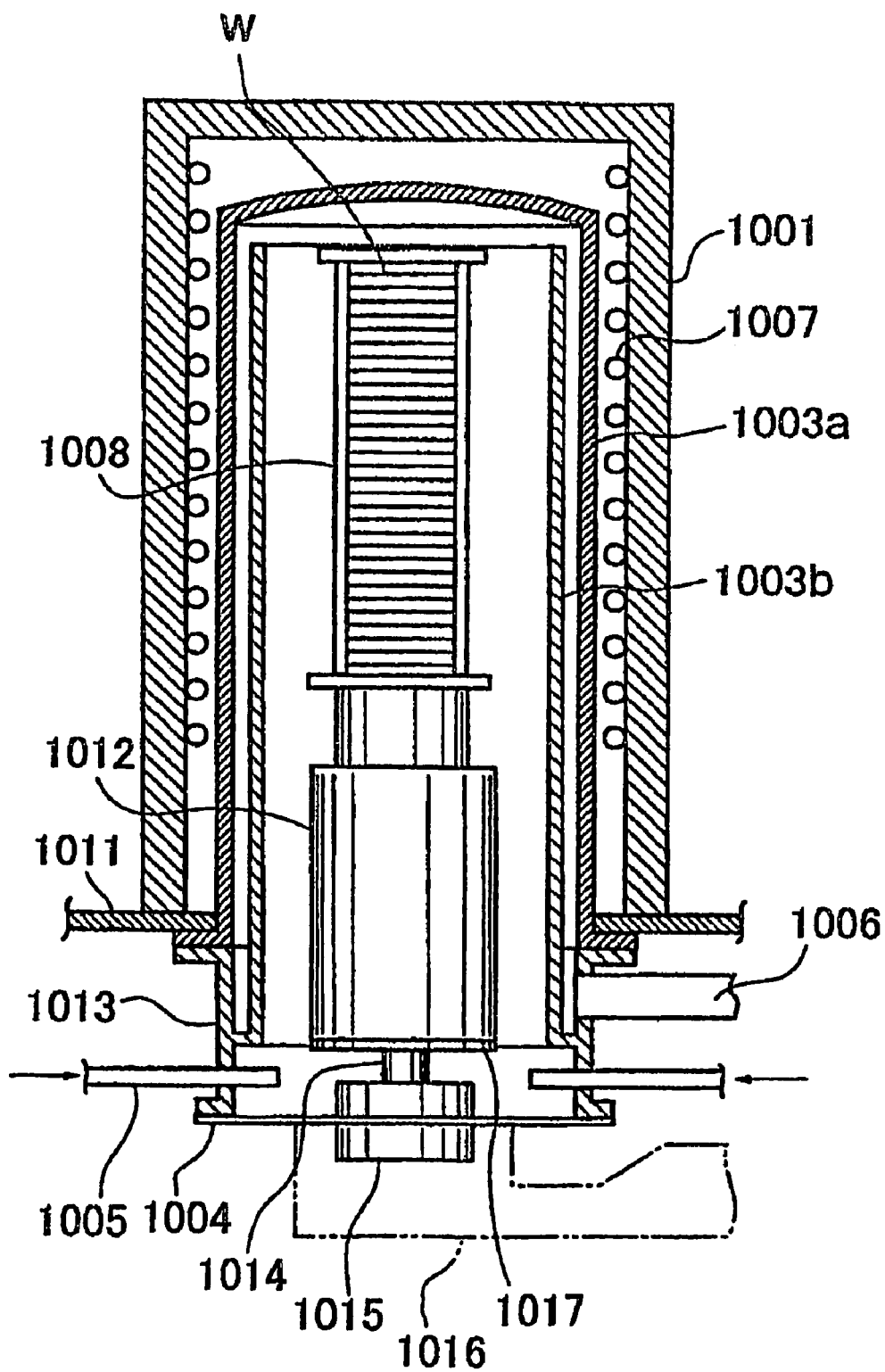
F I G. 10

HEAT TREATMENT APPARATUS

FIELD OF THE INVENTION

The present invention relates to a thermal processing unit that is suitable for a thermal process to an object to be processed such as a semiconductor wafer.

DESCRIPTION OF THE RELATED ART

Conventionally, in a semiconductor manufacturing process, there is a step of depositing a thin film or an oxide film onto a surface of a semiconductor wafer as an object to be processed, or a step of conducting a diffusion of impurities onto the surface. For these steps, a thermal processing unit such as a CVD unit, an oxide-film forming unit or a diffusion unit has been used.

In such a thermal processing unit, a plurality of wafers, which are objects to be processed, are placed on an object-to-be-processed holding member called a wafer boat in a vertical arrangement, and then loaded in a reaction tube called a process tube that has been heated to a high temperature. Then, a reaction gas is introduced into the reaction tube, so that a thermal process to the wafers is conducted (JP Laid-Open Publication No. 2001-210631 and JP Laid-Open Publication No. 2001-156005).

FIG. 10 shows an example of vertical thermal processing unit that has been conventionally used.

In FIG. 10, a heating-furnace body 1001 is placed on a base plate 1011. A resistance heater 1007 is provided on an inside surface of a heat-insulating layer of the heating-furnace body 1001.

A reaction tube (process tube) is provided in the heating-furnace body 1001. The reaction tube is surrounded by the resistance heater 1007. The reaction tube has a double-tube structure of an outer tube 1003a, whose upper end is closed, and an inner tube 1003b installed concentrically to the outer tube 1003a. The reaction tube is adapted to keep its airtightness, in order to form a processing space for conducting a process to wafers that are objects to be processed. The outer tube 1003a and the inner tube 1003b are made of, for example, quartz.

Respective lower ends of the outer tube 1003a and the inner tube 1003b are supported by a tubular manifold 1013 made of stainless steel or the like. A reaction-tube lower lid 1004 is provided for hermetically sealing a lower opening of the manifold 1013, the reaction-tube lower lid 1004 being freely opened and closed.

A rotational shaft 1014 is rotatably inserted at a central portion of the reaction-tube lower lid 1004 via a magnetic-fluid seal 1015 in such a manner that the airtightness of the reaction tube is maintained. A lower end of the rotational shaft 1014 is connected to a rotating mechanism of an elevating mechanism 1016. An upper end of the rotational shaft 1014 is fixed to a turntable 1017. A wafer boat 1008 (substrate-to-be-processed supporting member), which is a holding tool of objects to be processed, is mounted on the turntable 1017 via a heat-insulating cylinder 1012. A plurality of silicon wafers W are placed on the wafer boat 1008 in a tier-like manner. The wafer boat 1008 is made of, for example, quartz.

A or more gas-introducing pipes 1005 are horizontally arranged at a lower portion of the manifold 1013 in order to introduce a process gas for a wafer process into the inner tube 1003b of the reaction tube. The gas-introducing pipes 1005 are connected to a gas-supplying source, not shown, via a mass flow controller, not shown.

A gas-discharging pipe 1006 connected to a vacuum pump, not shown, is connected to an upper portion of the manifold 1013 in such a manner that the process gas is discharged from a gap between the outer tube 1003a and the inner tube 1003b to set a pressure in the reaction tube at a predetermined reduced pressure.

Herein, recently, it has been requested to enhance throughput of a semiconductor manufacturing unit, and various improvements have been achieved.

In order to enhance throughput of a semiconductor process without having any effect on film quality of a surface of the semiconductor wafer, the greatest possibility is to shorten times of the preliminary heating step and the cooling step. Then, in order to shorten the times of the steps, it is necessary to shorten the heating time and the cooling time. For that purpose, it is necessary to reduce thermal capacity of each member in the heating furnace in order to achieve rapid heating and rapid cooling.

However, in the conventional thermal processing unit, since the reaction tube has the double-tube structure, the thermal capacity thereof is large. Thus, the conventional thermal processing unit is not suitable for rapid heating and rapid cooling.

In addition, it is difficult to uniformly heat the reaction tube having the above structure. Thus, improvement of uniformity of the temperature of a silicon wafer within a surface thereof, which is a substrate to be processed, has been desired.

In addition, if the reaction gas introduced into the reaction tube doesn't react but reaches a ceiling part of the inner tube 1003b whose temperature is relatively low, the reaction gas may be deposited on the ceiling part, which may cause generation of particles.

Thus, the conventional thermal processing unit can not satisfy the recent request of: enhancing the throughput of a semiconductor manufacturing unit, making uniform the heated temperature of the substrate to be processed, and preventing the particle contamination.

SUMMARY OF THE INVENTION

An object of the present invention is to provide a thermal processing unit suitable for rapid heating and rapid cooling in which unevenness in heating an object to be processed such as a silicon wafer is improved.

Another object of the present invention is to achieve a thermal processing unit wherein temperature control is easy and wherein particle generation is effectively prevented.

This invention is a thermal processing unit comprising: a heating-furnace body whose upper end has an opening; a reaction tube consisting of a single tube contained in the heating-furnace body; a gas-discharging-unit connecting portion formed at an upper portion of the reaction tube, the gas-discharging-unit connecting portion having a narrow diameter; a substrate-to-be-processed supporting member for supporting a substrate to be processed, contained in the heating-furnace body; and a heating unit for heating the substrate to be processed supported by the substrate-to-be-processed supporting member; wherein the heating unit has: a first heating portion arranged around the reaction tube, a second heating portion arranged around the gas-discharging-unit connecting portion, a third heating portion arranged around an upper portion of the reaction tube, a fourth heating portion arranged around a lower portion of the reaction tube, and a fifth heating portion arranged under the substrate-to-be-processed supporting member.

According to the present invention, since the reaction tube consists of a single tube and has a smaller thermal capacity, rapid heating and rapid cooling of a substrate to be processed are possible. In addition, unevenness in heating the substrate to be processed is remarkably improved.

For example, the first heating portion may be formed by a plurality of linear heat-generating members, which are arranged in parallel with a longitudinal direction of the reaction tube. Alternatively, the first heating portion may be formed by a plurality of U-shaped heat-generating members, which are arranged in parallel with a longitudinal direction of the reaction tube.

In addition, the second heating portion may be formed by a linear heat-generating member, which is arranged in a spiral pattern.

In addition, the third heating portion may be formed by a linear heat-generating member, which is arranged in a spiral pattern. Alternatively, the third heating portion is formed by a linear heat-generating member, which is arranged in a switchback pattern.

In addition, the fourth heating portion may be formed by a linear heat-generating member, which is arranged in a spiral pattern that is seen as a rectangular in a circumferential direction of the reaction tube. Alternatively, the fourth heating portion may be formed by a linear heat-generating member, which is arranged in a switchback pattern.

In addition, the fifth heating portion may be formed by a plate-like heat-generating member. Alternatively, the fifth heating portion may be formed by a heat-generating member arranged along a lower surface of the substrate-to-be-processed supporting member.

In the above description, the linear heat-generating member may be formed by sealing a resistance heater into a hollow tubular member made of ceramics. On the other hand, the plate-like heat-generating member may be also formed by sealing a resistance heater into a hollow plate-like member made of ceramics. Thus, impurity contamination that may be caused by a material of the heat-generating member is not generated in the thermal processing unit. Herein, it is preferable that the ceramics is quartz.

In addition, it is preferable that the second heating portion is supported in a movable manner in a horizontal direction. In the case, assembling operation of the thermal processing unit and/or inserting operation and removing operation of the reaction tube into and from the heating-furnace body for maintenance may be carried out very easily.

In addition, the invention is a thermal processing unit comprising: a heating-furnace body whose upper end has an opening; a reaction tube consisting of a single tube contained in the heating-furnace body; a gas-discharging-unit connecting portion formed at an upper portion of the reaction tube, the gas-discharging-unit connecting portion having a narrow diameter; a substrate-to-be-processed supporting member for supporting a substrate to be processed, contained in the heating-furnace body; a heating unit for heating the substrate to be processed supported by the substrate-to-be-processed supporting member; and a reaction-tube lower lid that seals a lower portion of the reaction tube and holds airtightness in the reaction tube; wherein the substrate-to-be-processed supporting member has: a ceiling plate, a bottom plate, and a plurality of columns connecting the ceiling plate and the bottom plate; a pole for supporting the substrate-to-be-processed supporting member is fixed to a central portion of the bottom plate; and grooves for supporting the substrate to be processed are formed on the plurality of columns.

According to the above invention, the substrate-to-be-processed supporting member having a smaller thermal capacity can be easily manufactured.

Preferably, the pole is formed by a hollow member made of quartz. In the case, it is easier to process the pole, and impurity contamination is less.

In addition, the invention is a thermal processing unit comprising: a heating-furnace body whose upper end has an opening; a reaction tube consisting of a single tube contained in the heating-furnace body; a gas-discharging-unit connecting portion formed at an upper portion of the reaction tube, the gas-discharging-unit connecting portion having a narrow diameter; a substrate-to-be-processed supporting member for supporting a substrate to be processed, contained in the heating-furnace body; a heating unit for heating the substrate to be processed supported by the substrate-to-be-processed supporting member; a reaction-tube lower lid that seals a lower portion of the reaction tube and holds airtightness in the reaction tube; and a temperature measuring unit formed by sealing a plurality of temperature measuring members into a hollow tubular member.

According to the above invention, by using the result measured by the temperature measuring unit, more suitable temperature control can be achieved.

Preferably, the hollow tubular member is a quartz tube. In the case, impurity contamination that may be caused by the temperature measuring members may be prevented.

For example, the temperature measuring unit may be arranged in a vicinity of the heating unit.

In addition, for example, the hollow tubular member may be rotatably inserted through the reaction-tube lower lid into the reaction tube. The hollow tubular member may be rotatably and removably supported with respect to the reaction-tube lower lid. In addition, the hollow tubular member may be removably supported with respect to the substrate-to-be-processed supporting member. In the case, the hollow tubular member may be removed suitably, depending on situation, for example in assembling the thermal processing unit, in setting up the thermal processing unit or in normally operating the thermal processing unit.

In addition, preferably, the substrate-to-be-processed supporting member is adapted to horizontally support a plurality of substrates to be processed, and a portion of the hollow tubular member can be located in a gap between the plurality of substrates to be processed supported by the substrate-to-be-processed supporting member.

In addition, preferably, the hollow tubular member has a branched portion, and the plurality of temperature measuring members is also arranged in the branched portion.

In addition, preferably, the hollow tubular member has: a vertical portion extending upward along an inside wall of the reaction tube, a bend portion bent from the vertical portion at an upper portion of the reaction tube, and a horizontal portion extending horizontally from the bend portion. When a large number of substrates to be processed are supported, it is preferable that temperatures at an upper position, a middle position and a lower position of the substrates to be processed are adapted to be measured.

In the case, more preferably, the hollow tubular member further has: a branch portion branched from the vertical portion at a middle portion of the reaction tube in a longitudinal direction, and a second horizontal portion extending horizontally from the branch portion.

In addition, preferably, the hollow tubular member is arranged in a gap between the heating-furnace body and the reaction tube. In the case too, when a large number of substrates to be processed are supported, it is preferable that temperatures at an upper position, a middle position and a lower position of the substrates to be processed are adapted to be measured.

In addition, the invention is a thermal processing unit comprising: a heating-furnace body whose upper end has an opening; a reaction tube consisting of a single tube contained in the heating-furnace body; a gas-discharging-unit connecting portion formed at an upper portion of the reaction tube, the gas-discharging-unit connecting portion having a narrow diameter; a substrate-to-be-processed supporting member for supporting a substrate to be processed, contained in the heating-furnace body; a heating unit for heating the substrate to be processed supported by the substrate-to-be-processed supporting member; a reaction-tube lower lid that seals a lower portion of the reaction tube and holds airtightness in the reaction tube; a first temperature measuring unit formed by sealing a plurality of temperature measuring members into a first hollow tubular member; a second temperature measuring unit formed by sealing a plurality of temperature measuring members into a second hollow tubular member; and a third temperature measuring unit formed by sealing a plurality of temperature measuring members into a third hollow tubular member; wherein at least a portion of the first hollow tubular member extends horizontally from a middle portion of the reaction tube in a longitudinal direction; at least a portion of the second hollow tubular member extends horizontally from an upper portion of the reaction tube; and at least a portion of the third hollow tubular member is arranged in a gap between the heating-furnace body and the reaction tube.

According to the above invention, since the reaction tube consists of a single tube and has a smaller thermal capacity, rapid heating and rapid cooling of a substrate to be processed are possible. In addition, in manufacturing the thermal processing unit, in setting up the thermal processing unit, in a steady operation of the thermal processing unit, in a maintenance operation thereof, in adjusting the thermal processing unit, or the like, temperature measurement with high precision and high accuracy is possible, so that more suitable temperature control can be achieved.

In addition, the invention is a thermal processing unit comprising: a heating-furnace body whose upper end has an opening; a reaction tube consisting of a single tube contained in the heating-furnace body; a gas-discharging-unit connecting portion formed at an upper portion of the reaction tube, the gas-discharging-unit connecting portion having a narrow diameter; a substrate-to-be-processed supporting member for supporting a substrate to be processed, contained in the heating-furnace body; a heating unit for heating the substrate to be processed supported by the substrate-to-be-processed supporting member; a reaction-tube lower lid that seals a lower portion of the reaction tube and holds airtightness in the reaction tube; a second temperature measuring unit formed by sealing a plurality of temperature measuring members into a second hollow tubular member; and a third temperature measuring unit formed by sealing a plurality of temperature measuring members into a third hollow tubular member; wherein at least a portion of the second hollow tubular member extends horizontally from an upper portion of the reaction tube; and at least a portion of the third hollow tubular member is arranged in a gap between the heating-furnace body and the reaction tube.

According to the above invention, since the reaction tube consists of a single tube and has a smaller thermal capacity, rapid heating and rapid cooling of a substrate to be processed are possible. In addition, especially in a steady operation of the thermal processing unit, temperature measurement with high precision and high accuracy is possible, so that more suitable temperature control can be achieved.

In addition, the invention is a thermal processing unit comprising: a heating-furnace body whose upper end has an opening; a reaction tube consisting of a single tube contained in the heating-furnace body; a gas-discharging-unit connecting portion formed at an upper portion of the reaction tube, the gas-discharging-unit connecting portion having a narrow diameter; a substrate-to-be-processed supporting member for supporting a substrate to be processed, contained in the heating-furnace body; a heating unit for heating the substrate to be processed supported by the substrate-to-be-processed supporting member; a reaction-tube lower lid that seals a lower portion of the reaction tube and holds airtightness in the reaction tube; and two holes formed respectively at an upper portion and a lower portion in a gap between the heating-furnace body and the reaction tube; wherein a cooling medium is introduced from one of the two holes and discharged from the other of the two holes in order to cool the reaction tube.

According to the above invention, throughput of the thermal processing unit is improved.

In addition, the invention is a thermal processing unit comprising: a heating-furnace body whose upper end has an opening; a reaction tube consisting of a single tube contained in the heating-furnace body; a gas-discharging-unit connecting portion formed at an upper portion of the reaction tube, the gas-discharging-unit connecting portion having a narrow diameter; a substrate-to-be-processed supporting member for supporting a substrate to be processed, contained in the heating-furnace body; a heating unit for heating the substrate to be processed supported by the substrate-to-be-processed supporting member; a reaction-tube lower lid that seals a lower portion of the reaction tube and holds airtightness in the reaction tube; a second temperature measuring unit formed by sealing a plurality of temperature measuring members into a second hollow tubular member; and a third temperature measuring unit formed by sealing a plurality of temperature measuring members into a third hollow tubular member; wherein the heating unit has: a first heating portion arranged around the reaction tube, a second heating portion arranged around the gas-discharging-unit connecting portion, a third heating portion arranged around an upper portion of the reaction tube, a fourth heating portion arranged around a lower portion of the reaction tube, and a fifth heating portion arranged under the substrate-to-be-processed supporting member; at least a portion of the second hollow tubular member extends horizontally from an upper portion of the reaction tube; and at least a portion of the third hollow tubular member is arranged in a gap between the heating-furnace body and the reaction tube.

Alternatively, the invention is a thermal processing unit comprising: a heating-furnace body whose upper end has an opening; a reaction tube consisting of a single tube contained in the heating-furnace body; a gas-discharging-unit connecting portion formed at an upper portion of the reaction tube, the gas-discharging-unit connecting portion having a narrow diameter; a substrate-to-be-processed supporting member for supporting a substrate to be processed, contained in the heating-furnace-body; a heating unit for heating the substrate to be processed supported by the substrate-to-be-processed supporting member; a reaction-tube lower lid that seals a lower portion of the reaction tube and holds airtightness in the reaction tube; a first temperature measuring unit formed by sealing a plurality of temperature measuring members into a first hollow tubular member; a second temperature measuring unit formed by sealing a plurality of temperature measuring members into a second hollow tubular member; and a third temperature measuring unit formed by sealing a plurality of temperature measuring members into a third hollow tubular member; wherein the heating unit has: a first heating portion arranged around the reaction tube, a second heating portion arranged around the gas-discharging-unit connecting portion, a third heating portion arranged around an upper portion of the reaction tube, a fourth heating portion arranged around a lower portion of the reaction tube, and a fifth heating portion arranged under the substrate-to-be-processed supporting member; at least a portion of the first hollow tubular member extends horizontally from a middle portion of the reaction tube in a longitudinal direction; at least a portion of the second hollow tubular member extends horizontally from an upper portion of the reaction tube; and at least a portion of the third hollow tubular member is arranged in a gap between the heating-furnace body and the reaction tube.

According to these inventions, since the reaction tube consists of a single tube and has a smaller thermal capacity, rapid heating and rapid cooling of a substrate to be processed are possible. In addition, unevenness in heating the substrate to be processed is remarkably improved.

Preferably, a temperature controlling unit is provided around the gas-discharging-unit connecting portion. Thus, particle generation at the gas-discharging-unit connecting portion can be effectively prevented. For example, the temperature controlling unit is a heat-insulating material. Alternatively, the temperature controlling unit is a resistance heater. It is preferable that the temperature controlling unit has flexibility or that the temperature controlling unit is shaped in advance.

For example, the gas-discharging unit is a gas-discharging pipe whose end portion has a flange, a flange is formed at an end portion of the gas-discharging-unit connecting portion, and the flange at the end portion of the gas-discharging-unit connecting portion and the flange at the end portion of the gas-discharging pipe are hermetically connected to each other by means of a sealing unit. In the case, it is preferable that the temperature controlling unit has a fluid hole provided in the flange.

In addition, it is preferable that the gas-discharging-unit connecting portion is bent. Thus, effect of radiation heat from the reaction tube to the gas-discharging pipe is inhibited, so that temperature control of the gas-discharging-unit connecting portion and the gas-discharging pipe becomes easier.

BRIEF DESCRIPTION OF THE DRAWINGS

FIG. 2(a) is an enlarged partial view of FIG. 1, FIG. 2(b) is a top plan view of the spiral heat-generating member of FIG. 2(a);

FIG. 4(a) is an enlarged partial view of FIG. 1, FIG. 4(b) is a right side elevation view of the flat spiral heat-generating member of FIG. 4(a);

FIG. 10 is a schematic sectional view showing a conventional thermal processing unit.

DESCRIPTION OF THE PREFERRED EMBODIMENT

Hereinafter, embodiments of the present invention will be described with reference to the attached drawings.

First Embodiment

Figure 1:
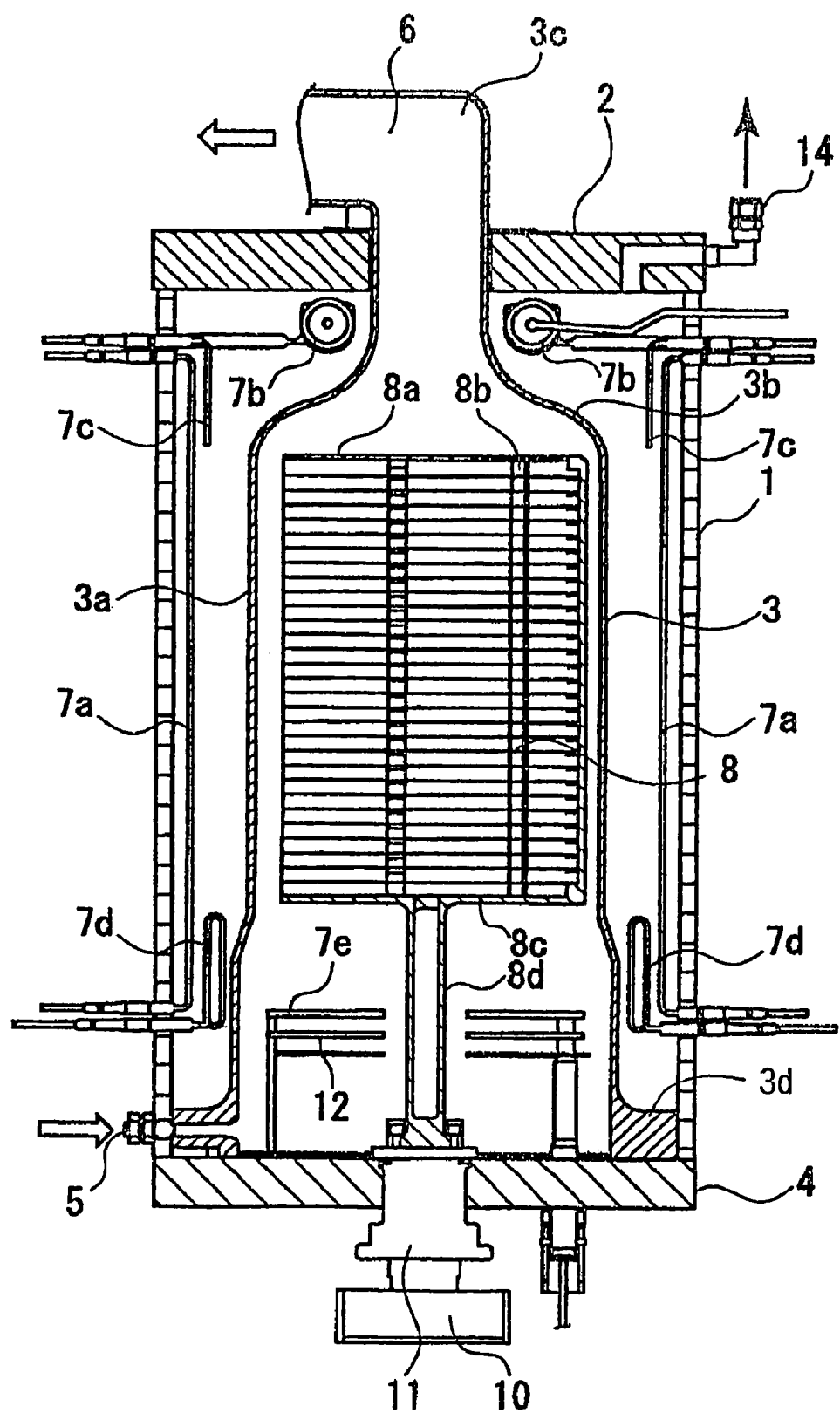
FIG. 1 is a schematic sectional view showing a thermal processing unit according to a first embodiment of the present invention.

FIG. 1 is a schematic sectional view showing a thermal processing unit according to a first embodiment of the present invention. The thermal processing unit of the embodiment comprises: a heating-furnace body 1 whose upper end is open; a heating-furnace lid 2 arranged at an upper portion of the heating-furnace body; and a reaction tube 3 whose main part is arranged in the heating-furnace body 1. The heating-furnace lid 2 has a hole through which a narrow-diameter portion of the reaction tube extending from an upper portion of the reaction tube 3 can be inserted. A reaction-tube lower lid 4 is provided at a bottom opening part of the reaction tube 3 in order to maintain airtightness in the reaction tube 3. Substrates to be processed W such as silicon wafers are adapted to be held by a substrate-to-be-processed supporting member 8, which is adapted to be arranged in the reaction tube 3. The substrates to be processed W such as silicon wafers are adapted to be heated by a heating unit 7.

In the thermal processing unit of the present embodiment, an upper end of the heating-furnace body 1 has an opening part. The opening part is covered with the heating-furnace lid 2. A central portion of the heating-furnace lid 2 is provided with an opening part. On the other hand, the upper end of the reaction tube 3 protrudes to form a gas-discharging-pipe connecting portion 6. Thus, after the reaction tube 3 is arranged in the heating-furnace body 1, the gas-discharging-pipe connecting portion 6 penetrates the opening part of the heating-furnace lid 2 so that the heating-furnace body 1 is covered with the heating-furnace lid 2. Preferably, the heating-furnace lid 2 is formed by combination of a plurality of dividable members.

It is preferable that a cylindrical heat reflector is provided on an inside-wall surface of the heating-furnace body 1. For example, the heat reflector is made of aluminum. The inside surface of the heat reflector is formed as a mirror surface, which inhibits heat dissipation of radiant heat from the heating unit, which is described below. A cooling-medium way such as a cooling-water way may be formed in a coil pattern in the heat reflector. The cooling-medium way may be formed as a wide space, instead of a thin channel.

(Reaction Tube)

The reaction tube 3 arranged in the heating-furnace body 1 is a single tube made of ceramics such as quartz glass or silicon carbide. The reaction tube 3 has: a bottom opening part, a reaction-tube cylindrical portion 3a surrounding the substrate-to-be-processed supporting member, a narrow-diameter portion 3b located at an upper portion thereof, a bend portion 3c bent at an angle of about 90 degrees above the narrow-diameter portion 3b, and a gas-discharging port 6 extending in a radius direction of the reaction tube 3 from the bend portion 3c for discharging a reaction gas or the like. Under the reaction tube, a reaction-tube lower flange 3d is formed in order to secure airtightness to the reaction-tube lower lid 4. At least one reaction-gas introducing pipe 5 is arranged in the reaction-tube lower flange 3d. A reaction gas for processing the substrates to be processed such as semiconductor wafers is adapted to be supplied from the reaction-gas introducing pipe 5.

In addition, a manifold made of stainless steel or the like may be arranged at a lower portion of the reaction tube 3. In the case, the lower opening part of the reaction tube 3 and the manifold are hermetically connected by means of an O-ring or the like. In the case, the reaction-gas introducing pipe may be inserted through a side wall of the manifold. In addition, the reaction-tube lower lid 4 may be connected to a lower portion of the manifold via an O-ring. Thus, airtightness in the reaction tube may be maintained.

(Substrate-to-be-processed Supporting Member)

In the reaction tube 3, a substrate-to-be-processed supporting member 8 made of ceramics such as quartz is arranged. The substrate-to-be-processed supporting member 8 is called a wafer boat, and holds a plurality of, for example about 126, substrates to be processed W such as semiconductor wafers horizontally, at the same intervals (pitches) in a vertical direction. The wafer boat has a ceiling plate 8a, a bottom plate 8c, a plurality of columns 8b fixedly jointing the ceiling plate 8a and the bottom plate 8c, and a supporting body 8d fixed to a central portion of the bottom plate 8c. Grooves are formed on each column, in order to hold horizontally the substrates to be processed. These grooves are adapted to support peripheral edge portions of the substrates to be processed W.

Then, the supporting body 8d is connected to a rotational shaft of a rotation driving unit 10 through a sealing unit 11 such as a magnetic-fluid seal arranged at a central portion of the reaction-tube lower lid 4. Thus, the substrate-to-be-processed supporting member 8 can be rotated during the thermal processing step.

The substrate-to-be-processed supporting member 8, the reaction-tube lower lid-4, the sealing unit 11 and the rotation driving unit 10 are connected to an elevating mechanism not shown, so that the substrate-to-be-processed supporting member 8 can be taken out from the reaction tube 3. The substrates to be processed W can be placed on the substrate-to-be-processed supporting member 8 at a position wherein the substrate-to-be-processed supporting member 8 is taken out from the reaction tube 3.

(Heating Unit)

The heating unit 7 consists of: a first heating unit (a first heating portion) 7a arranged around the cylindrical portion 3a of the reaction tube 3, a second heating unit (a second heating portion) 7b arranged around the narrow-diameter portion 3b of the reaction tube 3, a third heating unit (a third heating portion) 7c arranged around an upper portion of the cylindrical portion 3a of the reaction tube 3, a fourth heating unit (a fourth heating portion) 7d arranged around a lower portion of the cylindrical portion 3a of the reaction tube 3, and a fifth heating unit (a fifth heating portion) 7e arranged under the substrate-to-be-processed supporting member 8 in the reaction tube 3. Hereinafter, each heating unit is explained in detail.

(First Heating Unit)

The first heating unit 7a consists of a plurality of linear heat-generating members (devices), which are arranged around the cylindrical portion 3a of the reaction tube 3 and in parallel with a longitudinal direction of the reaction tube 3. Specifically, a large number of linear heat-generating members are arranged at intervals of several centimeter orders. Instead of the straight linear heat-generating members arranged in parallel with a longitudinal direction of the reaction tube 3, a plurality of U-shaped linear heat-generating members may be arranged to surround the reaction tube 3.

The linear heat-generating member is a linear flexible resistance heater of a high purity material. Herein, a carbon wire formed by twisting (b raiding) a plurality of strands of carbon fibers of about 10 μm in diameter is arranged in a ceramics tube such as a straight quartz tube having an outside diameter of ten-some millimeters. The end portions of the ceramics tube are sealed so as to be connected to outside terminals for electric power supply.

Such a linear heat-generating member is superior in dynamic temperature characteristics since it has only a small thermal capacity. Thus, rapid heating and rapid cooling are possible, and control thereof is easy.

The first heating unit 7a is operated by electric power controlled by a controlling unit not shown. At that time, the same electric power may be supplied to the whole first heating unit 7a. However, the first heating unit 7a may be divided into a plurality of groups, and respective different electric power may be supplied to the respective groups to control respective heat values of the respective groups.

The plurality of groups of the first heating unit 7a may be operated both in any series circuit and in any parallel circuit.

(Second Heating Unit)

Figure 2:
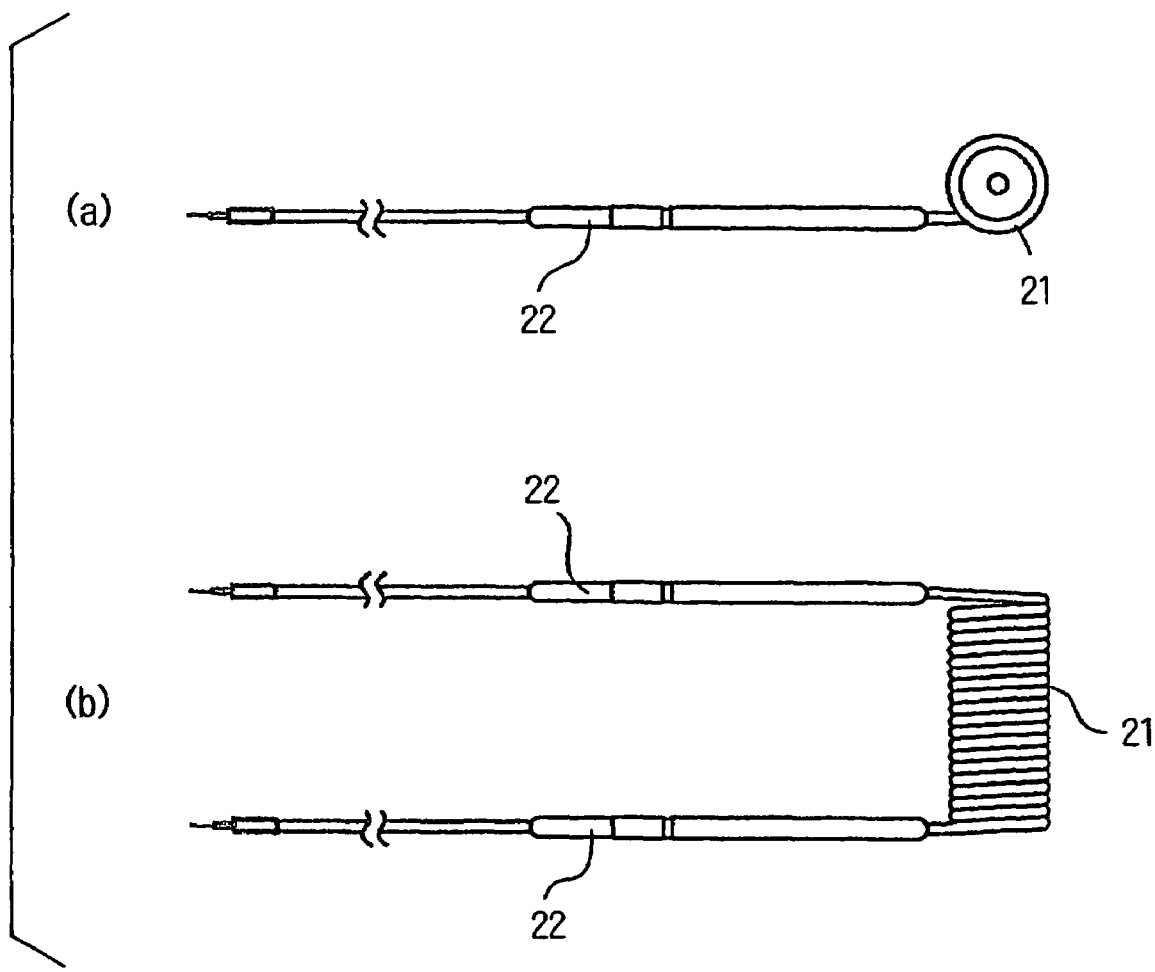
FIG. 2 is a schematic view showing a heat-generating member in a spiral pattern used in the thermal processing unit of the first embodiment.

The second heating unit 7b is arranged around the narrow-diameter portion 3b of the upper portion of the cylindrical portion 3a of the reaction tube 3. Specifically, as shown in FIGS. 2(a) and 2(b), the second heating unit 7b has a structure wherein a linear heat-generating member is wound in a spiral pattern. Such structure can increase heat value per unit volume.

The second heating unit 7b is arranged at a plurality of positions around the narrow-diameter portion 3b of the reaction tube 3, in order to heat a central portion of an uppermost substrate to be processed W supported by the substrate-to-be-processed supporting member 8. An area above the central portion of the uppermost substrate to be processed W supported by the substrate-to-be-processed supporting member 8 is near to the gas-discharging port 6, which discharges the gas from the reaction tube 3, and far from the first heating unit 7a. Then, temperature of the area may easily fall. Thus, for example, the second heating unit 7b of a spiral pattern is arranged to heat the central portion of the uppermost substrate to be processed W supported by the substrate-to-be-processed supporting member 8, so that unevenness of temperature within the surface of the substrate to be processed may be improved.

A terminal connected to the spiral heat-generating member is located out of the heating-furnace body 1, and is adapted to be supplied electric power from a controlling unit not shown.

The above heat-generating member of a spiral pattern may be formed by a carbon wire that is a resistance heater, which is arranged in a tube made of a material having electrical insulating properties and heat resistance properties, such as quartz, similarly to the linear heat-generating member of the first heating unit 7a. The materials of the tube and the resistance heater are not limited to quartz and carbon, but may be materials having substantially the same functions.

It is preferable that four heat-generating members of a spiral pattern are arranged at four positions around the narrow-diameter portion 3b of the reaction tube 3. In the case, it is preferable that one of the four heat-generating members is movable in a horizontal direction.

In the case, there is no obstacle in an assembling operation of the thermal processing unit or in a disassembling operation thereof for maintenance.

(Third Heating Unit)

Figure 3:
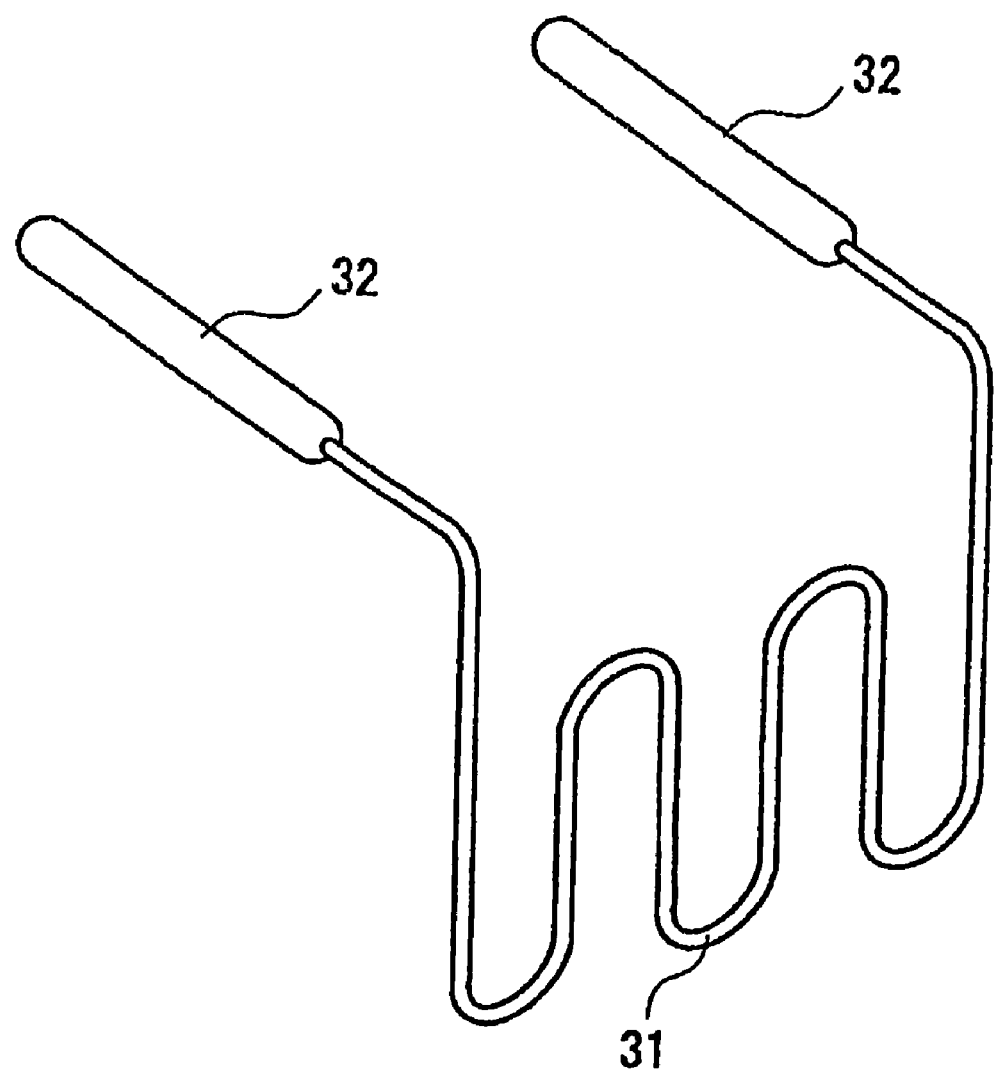
FIG. 3 is a schematic perspective view showing a heat-generating member in a switchback pattern used in the thermal processing unit of the first embodiment of the present invention.

A plurality of third heating units 7c are arranged so as to surround the upper portion of the cylindrical portion 3a of the reaction tube 3. Specifically, each third heating unit 7c may have a structure wherein a linear heat-generating member is bent in a switchback pattern as shown in FIG. 3, or a structure wherein a linear heat-generating member is wound in a spiral pattern as shown in FIGS. 2(a) and 2(b). In an example shown in FIG. 3, electric power supplying terminals 32 are connected to the both ends of the linear heat-generating member 31. It is preferable that the third heating unit 7c is formed by a carbon wire heater contained in a quartz tube as well as the first and second heating units 7a and 7b.

By arranging the third heating units 7c, unevenness in heating the upper portion of the reaction tube 3 may be improved.

(Fourth Heating Unit)

Figure 4:
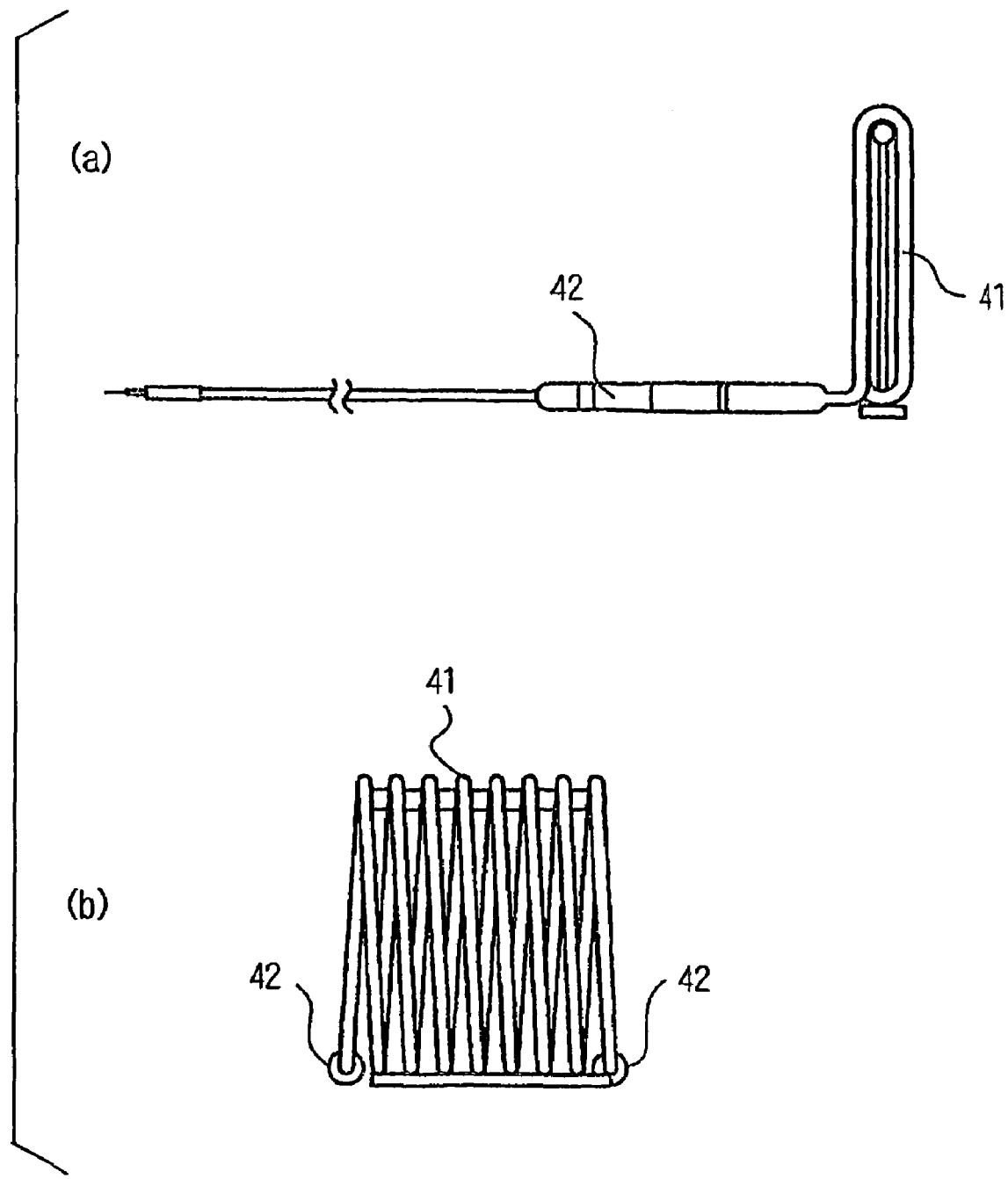
FIG. 4 is a schematic view showing a heat-generating member in a flat spiral pattern used in the thermal processing unit of the first embodiment.

A plurality of fourth heating units 7d are arranged so as to surround the lower portion of the cylindrical portion 3a of the reaction tube 3. Specifically, each fourth heating unit 7d may have a structure wherein a linear heat-generating member like the linear heat-generating member of the first to third heating unit is wound in a flat spiral pattern as shown in FIGS. 4(a) and 4(b), or a structure wherein a linear heat-generating member is bent in a switchback pattern as shown in FIG. 3.

By arranging the fourth heating units 7d, heat dissipation from the lower portion of the reaction tube 3 is prevented, and hence temperature fall of an lowermost substrate to be processed W supported by the substrate-to-be-processed supporting member 8 is prevented. Thus, it is preferable that the fourth heating units 7d are arranged under the bottom plate of the substrate-to-be-processed supporting member 8.

The concrete shape of each fourth heating unit 7d and/or the arrangement number of the fourth heating units 7d may be suitably designed based on thermal calculation.

(Fifth Heating Unit)

The fifth heating unit 7e is arranged in order to prevent heat dissipation downward from the bottom plate of the substrate-to-be-processed supporting member 8 arranged in the reaction tube 3, and hence temperature fall of the lower portion of the substrate-to-be-processed supporting member 8. For the purpose of the above, for example, the fifth heating unit 7e consists of a plate-like heat-generating member having a disk shape, or a plate-like heat-generating member formed by arranging a heat-generating member along the bottom surface of the substrate-to-be-processed supporting member 8. An opening part is formed at a central portion of the fifth heating unit 7e. A pole 8d supporting the substrate-to-be-processed supporting member 8 is inserted through the opening part.

The plate-like heat-generating member forming the fifth heating unit 7e may be a film resistance heater formed into a disk shape, or a linear resistance heater densely arranged on a plane. When a linear resistance heater is used, a linear resistance heater of low metal impurity may be sealed into ceramics such as quartz. For example, a linear resistance heater such as a carbon wire made of high purity carbon may be arranged in a coil pattern or a switchback pattern in a disk member made of quartz (quartz plate) having a thickness of about 8 mm. In addition, quartz may be interposed between adjacent linear resistance heaters. In the case, the linear resistance heaters may be arranged between spiral partition walls made of quartz. It is preferable that the plate-like heat-generating member has a size not smaller than that of the substrate to be processed W, in order to secure high heat-retention effectiveness.

When the fifth heating unit 7e is formed by a plurality of resistance heaters, each resistance heater may have a block shape or any other shape, and the resistance heaters may be arranged along the bottom surface of the substrate-to-be-processed supporting member 8. The plurality of resistance heaters may be arranged in such a manner that their heating temperatures are uniform.

When a plate-like heat-generating member is used, for example, columns made of quartz may be provided at three peripheral positions at the same intervals in a circumferential direction on the lower surface of the plate-like heat-generating member. The columns are fixed to the reaction-tube lower lid. One of the three columns may be formed by a tubular member. Both end portions of the linear resistance-heaters are gathered at one peripheral portion of the plate-like heat-generating member. A pair of feeder members connected to the resistance heaters, for example a pair of feeder wires of the same material as the resistance heaters, is inserted through a thin quartz tube, and the quartz tube is inserted through the tubular member (column). Then, the feeder wires may be arranged out of the lid. When the feeder wires are connected to an outside electric power source, the resistance heaters generate heat. Residual two columns may be tubular members or rod members.

In addition, it is preferable that a heat reflector 12 having an opening part at a central portion thereof is arranged under the fifth heating unit 7e formed by a plate-like heat-generating member via a gap in parallel with the plate-like heat-generating member 7e. The heat reflector 12 reflects heat generated by the plate-like heat-generating member and prevents downward heat dissipation. The number of provided heat reflectors 12 may be single or plural. It is preferable that the plate-like heat-generating member and the heat reflector 12 have substantially the same shape. The plate-like heat-generating member and the heat reflector 12 are fixed to the reaction-tube lower lid 4, as shown in FIG. 1.

The heat reflector 12 may be made of, for example, opaque quartz or silicon carbide.

The five kinds of heating units 7a to 7e of the present embodiment are independently controlled by a controlling unit not shown (appropriately supplied electric power), so that respective heat values thereof are controlled. Thus, temperature distribution in the reaction tube 3 may be made uniform.

According to the above heating units 7a to 7e, the temperature control is easy, and particle generation may be prevented effectively. In addition, since the thermal capacity is small, the embodiment is suitable for rapid heating and rapid cooling, and unevenness in heating the substrates to be processed such as the silicon wafers may be remarkably improved.

In the present embodiment, the five heating units 7a to 7e heat the substrates to be processed W arranged in the reaction tube 3. The heating units 7a to 7e cooperate to make temperature distribution within the surfaces of the substrates to be processed W as uniform as possible. Additional other heating units may be used as far as volume limitation of the heating-furnace body 1 permits.

Second Embodiment

Figure 5:
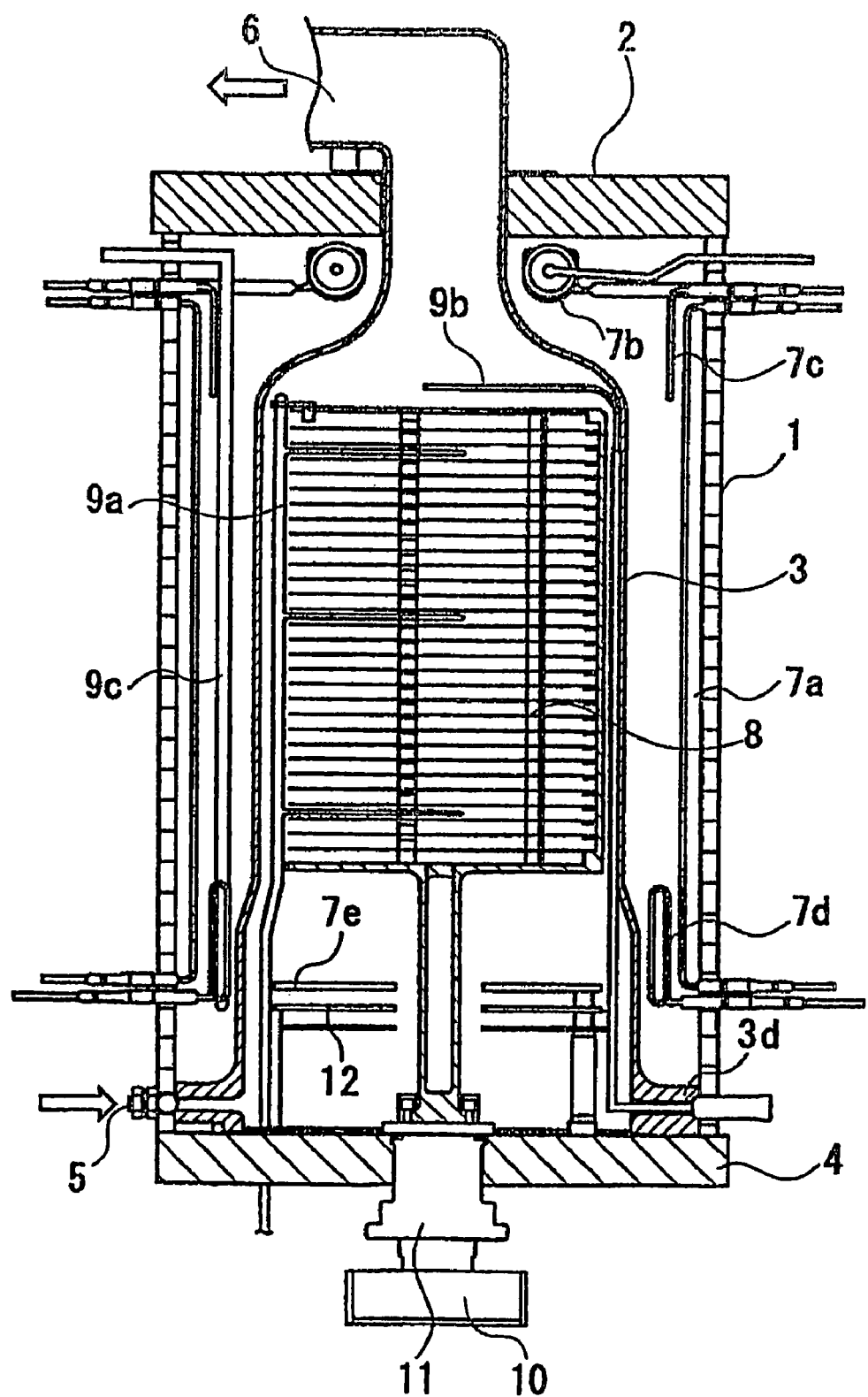
FIG. 5 is a schematic sectional view showing a thermal processing unit according to a second embodiment of the present invention.

In the present embodiment, additionally to the thermal processing unit of the first embodiment, a temperature measuring unit for measuring a thermal process temperature of the substrates to be processed is provided. FIG. 5 schematically shows a thermal processing unit according to the present embodiment. As shown in FIG. 5, in the present embodiment, three temperature measuring units are arranged. In FIG. 5, a component having the same function as in FIG. 1 is represented by the same numeral sign, and the detailed explanation thereof is omitted.

Hereinafter, the temperature measuring units that are features of the present embodiment are mainly explained.

(First Temperature Measuring Unit)

The first temperature measuring unit 9a has: a main-shaft portion consisting of a straight hollow tubular member; and a branch portion branched from the main-shaft portion at a middle position thereof in a perpendicular direction thereto. A known temperature measuring device such as a thermocouple is sealed in the branch portion. Herein, it is preferable that a plurality of temperature measuring devices is sealed therein in order to measure temperatures at a plurality of positions at the same time. For example, the hollow tubular member is made of ceramics such as silicon carbide or quartz.

Figure 6:
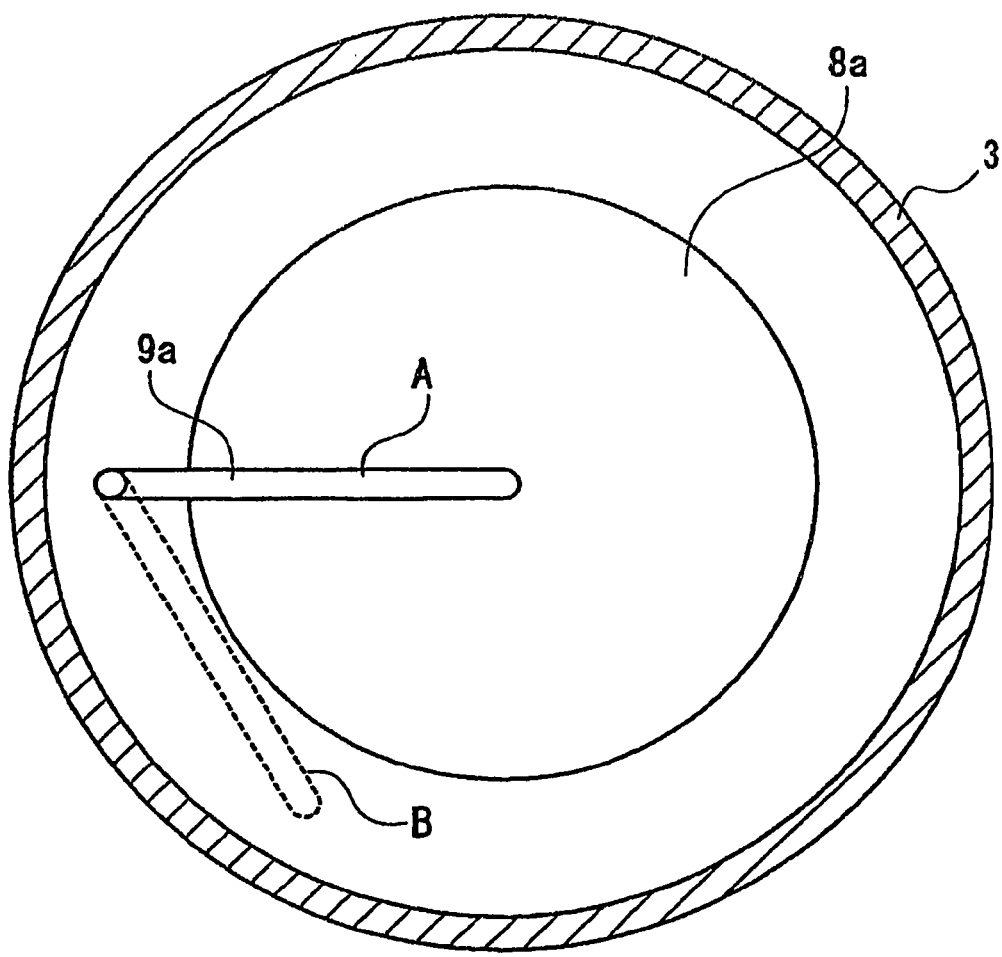
FIG. 6 is a schematic sectional view showing a main part of the thermal processing unit for explaining movement of a temperature measurement member (device) in the second embodiment of the present invention.

The temperature measuring unit 9a is arranged perpendicular to the reaction-tube lower lid 4. Specifically, the temperature measuring unit 9a is inserted through a vertical hole formed in the reaction-tube lower lid 4 in such a manner that airtightness can be maintained and the temperature measuring unit 9a can rotate around an axis perpendicular to the reaction-tube lower lid 4. That is, as seen from FIG. 6 that is a top plan view of a section of the reaction tube 3, the branch portion of the temperature measuring unit 9a is capable of pivoting between an arrangement state (position A) wherein a tip end thereof is located in the vicinity of a center of the ceiling plate 8a of the substrate-to-be-processed supporting member 8 and an arrangement state (position B) wherein the tip end thereof is located out of the ceiling plate 8a of the substrate-to-be-processed supporting member 8. Then, when the temperature measuring unit 9a is located at the position A, the plurality of temperature measuring devices arranged in the branch portion of the temperature measuring unit 9a can measure temperatures at a plurality of positions on the surfaces of the substrates to be processed. Thus, temperature distribution within the surfaces of the substrates to be processed can be monitored.

When the branch portion of the temperature measuring unit is moved to the position B, temperatures at peripheral positions of the substrates to be processed can be measured.

It is preferable that a plurality of branch portions is branched from the main-shaft portion in the temperature measuring unit 9a, in order to enhance temperature measurement precision. Especially, it is preferable that they are arranged in at least three positions including an upper gap, a middle gap and a lower gap of the plurality of substrates to be processed W.

The temperature measuring unit 9a in the present embodiment is removably arranged in the reaction tube via the hole formed in the reaction-tube lower lid 4. When heating characteristics of the thermal processing unit are evaluated at setting up the thermal processing unit or the like, surface temperatures of the substrates to be processed as objects to be heated have to be measured. For that purpose, the temperature measuring unit 9a is mainly used. On the other hand, in a steady operation of the thermal processing unit, necessity to use the temperature measuring unit 9a is small. Thus, in a steady operation of the thermal processing unit, the temperature measuring unit 9a can be taken out from the thermal processing unit so that the temperature measuring unit 9a doesn't disturb the thermal processing step.

In addition, it is preferable that an upper end of the main-shaft portion of the hollow tubular member is removably supported by the ceiling plate 8a of the substrate-to-be-processed supporting member 8. Thus, temperature measurement can be stably conducted without vibration of the main-shaft portion of the hollow tubular member during n operation of the thermal processing unit.

(Second Temperature Measuring Unit)

The second temperature measuring unit 9b is a temperature measuring device such as a thermocouple sealed in a ceramics hollow member such as a quartz tube or a silicon carbide tube, similarly to the first temperature measuring unit 9a. The second temperature measuring unit 9b extends upward along a inside wall of the reaction tube 3 from a reaction-tube lower flange 3d, and is bent at an upper portion of the reaction tube 3 toward a center of the reaction tube 3. A plurality of temperature measuring devices is sealed at a plurality of positions of the hollow tubular member. The second temperature measuring unit 9b operates in a steady operation of the thermal processing unit in order to measure temperatures in the vicinity of the substrates to be processed. Thus, the operating condition in the steady operation of the thermal processing unit can be known (detected).

(Third Temperature Measuring Unit)

The third temperature measuring unit 9c is also formed by sealing a temperature measuring device into a ceramics hollow member, similarly to the first and second temperature measuring units 9a and 9b. The third temperature measuring unit 9c is arranged in a gap formed between the heating-furnace body 1 and the reaction tube 3, in parallel with the longitudinal direction of the reaction tube 3. A plurality of temperature measuring devices is arranged in the hollow tubular member of the third temperature measuring unit 9c. Thus, temperature measurement with high precision is possible. The third temperature measuring unit 9c operates in a steady operation of the thermal processing unit in order to measure peripheral temperatures of the reaction tube 3. Thus, the operating condition of the thermal processing unit can be known (detected).

In the present embodiment, the temperature measuring units 9a to 9c are arranged in the unit of the first embodiment. Thus, temperature measurement with high precision is conducted so that the operating condition of the thermal processing unit can be known (detected). Then, based on information about the temperature distribution in the reaction tube 3 measured by the temperature measuring units 9a to 9c, the heating units 7a to 7e may be controlled, so that the temperatures of the substrates to be processed W may be made uniform.

In the second embodiment, the three temperature measuring units 9a to 9c are provided. However, if at least one of the temperature measuring units is adopted, the effect may be expected. It is most preferable that all the three temperature measuring units are provided. In addition, additional other temperature measuring units may be arranged unless they disturb the operation of the thermal processing unit.

Third Embodiment

Figure 7:
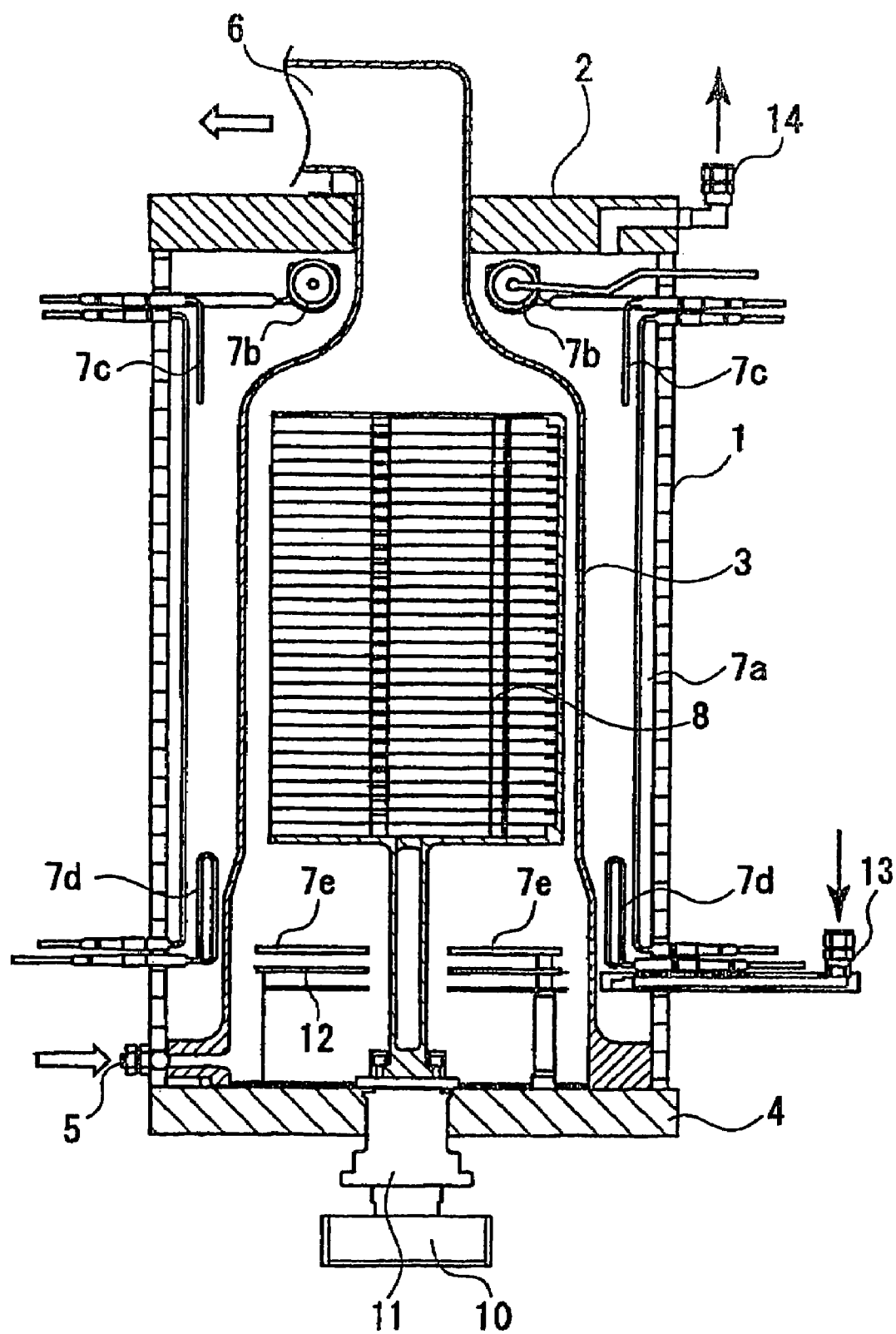
FIG. 7 is a schematic sectional view showing a thermal processing unit according to a third embodiment of the present invention.

In the present embodiment, additionally to the thermal processing unit of the first embodiment, a cooling mechanism for forcibly cooling the reaction tube 3 is provided. FIG. 7 schematically shows a thermal processing unit according to the present embodiment. In FIG. 7, a component having the same function as in FIG. 1 is represented by the same numeral sign, and the detailed explanation thereof is omitted.

Hereinafter, the cooling mechanism that is a feature of the present embodiment is mainly explained.

As seen in FIG. 7, the cooling mechanism consists of: a cooling-medium supplying port 13 formed at a lower portion of the wall of the heating-furnace body 1; a cooling-medium supplying system having a cooling-medium supplying unit connected to the cooling-medium supplying port 13 and not shown; and a cooling-medium discharging port 14 formed at the heating-furnace lid 2.

A medium such as cooling air is pressed from the cooling-medium supplying unit into the heating-furnace body 1 via the cooling-medium supplying port 13 by means of a compressing unit such as a pump. Thus, the reaction tube 3 is cooled forcibly. It is sufficient that at least one cooling-medium supplying port 13 is provided. However, preferably, a plurality of cooling-medium supplying ports 13 is provided in order to uniformly cool the periphery of the reaction tube.

By means of the cooling mechanism, cooling period of the thermal processing unit can be shortened, and throughput of the thermal processing unit can be enhanced.

Fourth Embodiment

In the fourth embodiment, additionally to the thermal processing unit of the first embodiment, provided are the temperature measuring unit 8 explained in the second embodiment, the cooling mechanism 13, 14 explained in the third embodiment, and a temperature controlling unit 15 for controlling a temperature in the vicinity of a connecting portion of the gas-discharging port 6 at the upper portion of the reaction tube 3 and the gas-discharging pipe 16.

Figure 8:
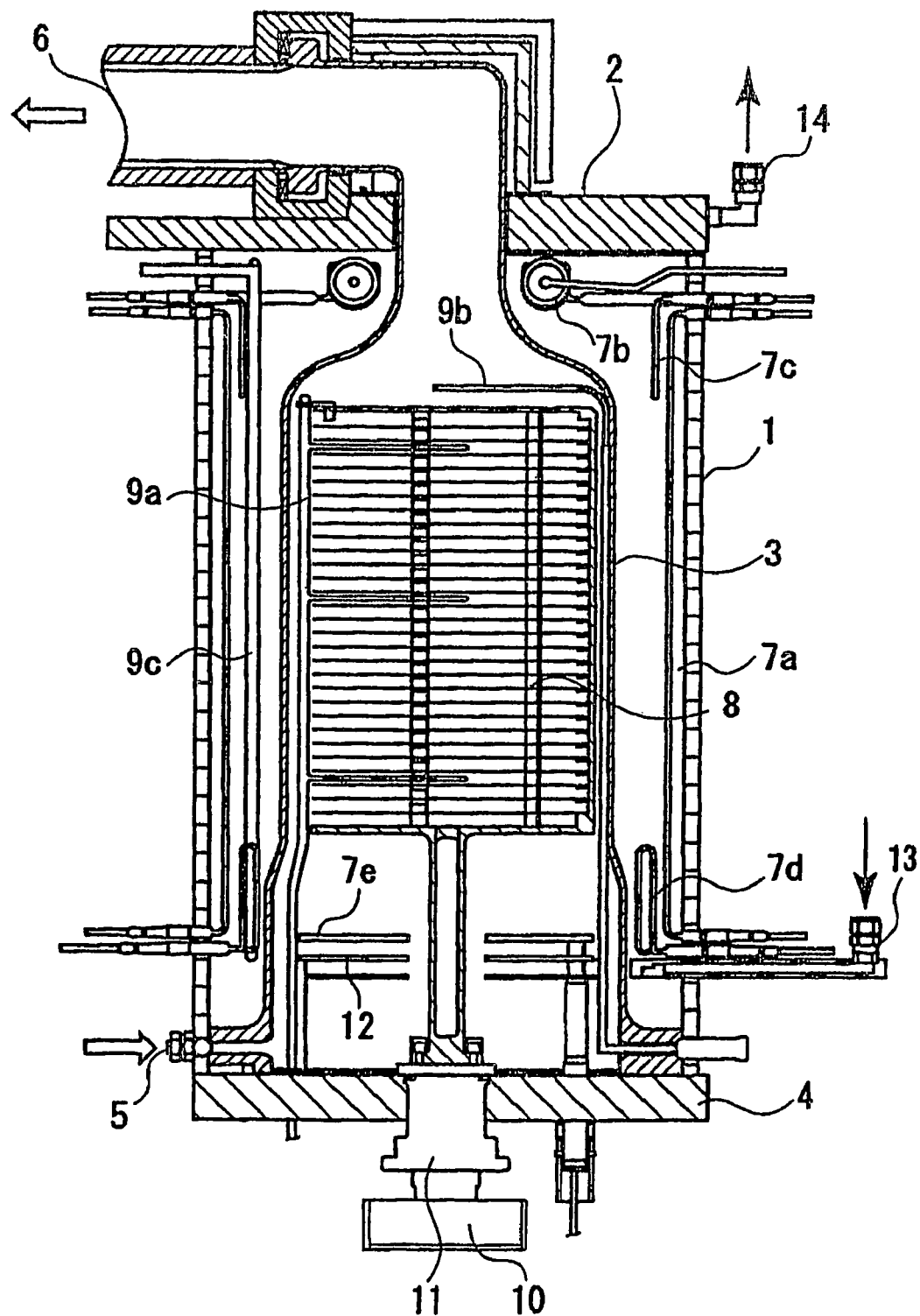
FIG. 8 is a schematic sectional view showing a thermal processing unit according to a fourth embodiment of the present invention.

FIG. 8 schematically shows a thermal processing unit according to the present embodiment. In FIG. 8, a component having the same function as in FIG. 1, FIG. 5 or FIG. 7 is represented by the same numeral sign, and the detailed explanation thereof is omitted.

Hereinafter, the temperature controlling unit for controlling a temperature in the vicinity of a connecting portion of the gas-discharging port and the gas-discharging pipe, which is a feature of the present embodiment, is mainly explained.

As described above, the thermal processing unit of the present embodiment has: the heating-furnace body 1; the five kinds of heating units 7a to 7e; the three kinds of temperature measuring units 9a to 9c: and the cooling mechanism 13, 14. In this unit, the gas-discharging port 6 and the bent portion 3c extending form the narrow-diameter portion 3b at the upper portion of the reaction tube 3 protrude from the heating-furnace body 1. Thus, temperatures at these portions are lower than the temperature in the heating-furnace body 1. Then, if the temperatures at these portions are relatively low, a reaction gas supplied into the reaction tube 3 and/or a generated gas generated in the reaction tube 3 are cooled at these portions, so that deposit or an impurity film is formed. If the undesired film grows, it gradually becomes easier for the film to peel off. When the film (deposit) peels off because of thermal stress or the like, the film becomes particles, falls in the reaction tube 3, and contaminates the substrates to be processed W such as the silicon wafers. For avoiding this problem, the temperature at the upper area of the reaction tube 3 is controlled so that generation of deposit that may cause particle contamination is prevented.

As the temperature controlling unit 15 arranged in the vicinity of the connecting portion of the gas-discharging port 6 and the gas-discharging pipe 16, a heat-insulating material or a resistance heater may be used. In particular, it is preferable that a resistance heater is used as the temperature controlling unit 15 in order to enhance the effect of heat-retaining.

In addition, the temperature of the gas-discharging-pipe connecting portion is preferably equal to a wafer process temperature (processing temperature). Thus, uniformity of temperatures of the wafers arranged in an upper portion of the reaction tube 3 can be remarkably improved. In addition, in the case, the number of dummy wafers, which are generally arranged on the uppermost stages of the substrate-to-be-processed supporting member for the uniformity of temperatures of the wafers, can be reduced. Thus, the height of the heating unit may be reduced.

Figure 9:
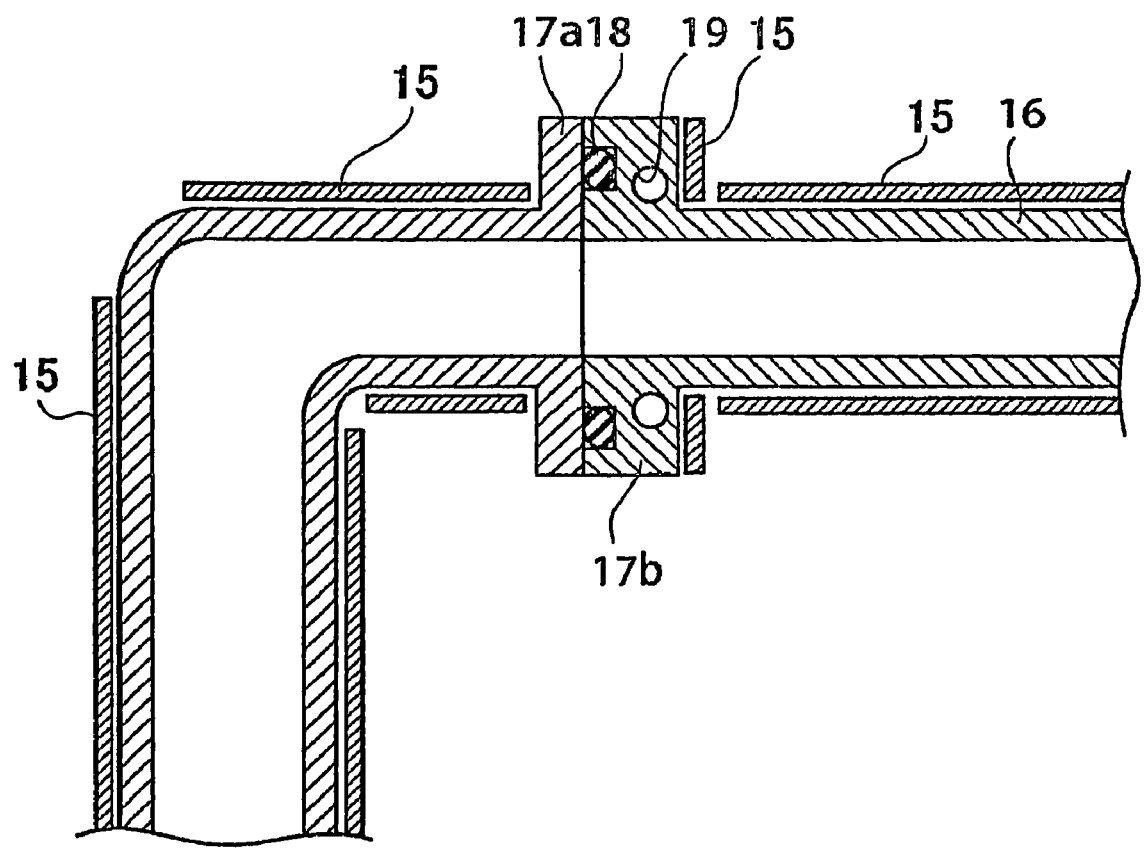
FIG. 9 is a schematic sectional view showing a main part of the thermal processing unit of the fourth embodiment of the present invention.

In FIG. 9, the temperature controlling unit 15 is formed by a plurality of divided components. However, the components may be integral.

Preferably, the resistance heater is a heater made of a carbon wire including fewer impurities. In addition, the heating unit may be a flexible heater that can be wound around the gas-discharging-pipe connecting portion having a complicated shape, or may be a heater that has been formed in advance into a shape to be fitted with the shape of the gas-discharging-pipe connecting portion.

As the flexible heater, a carbon wire may be used, the carbon wire including: a wire-like heater-main-body formed by braiding a plurality of carbon fibers; and metal terminals attached to both ends of the heater-main-body. Such a flexible heater may be installed by winding around the gas-discharging-pipe connecting portion of the upper portion of the reaction tube 3.

Alternatively, as the previously-shaped heater, a seal heater may be used, the seal heater being formed by forming the above carbon wire into a predetermined shape, sandwiching the carbon wire between two quartz glass plates, and heating the two quartz glass plates to melt them and fix them to the carbon wire in a predetermined shape. The seal heater made of quartz glass has only very low possibility of impurities contamination, which is suitable for the present invention.

In any case, in order to avoid impurities contamination, it is preferable to design the unit in such a manner that a temperature controlling unit may be easily arranged in the unit.

As shown in FIG. 8, it is preferable that the gas-discharging-pipe connecting portion 6 is bent at an angle of about 90 degrees toward a lateral direction of the reaction tube 3. If the temperature of the connecting portion of the gas-discharging-pipe connecting portion 6 and the gas-discharging pipe 16 is lower than that of the main body of the reaction tube 3, the reaction gas and/or the generated gas remaining in the exhaust gas are cooled to be solidified in that portion, so that impurity films may be formed in that portion. Then, the impurity films may be peeled off to generate particles. Thus, if the connecting portion is located just above the substrate-to-be-processed supporting member, the particles generated at the connecting portion may fall directly on the substrate-to-be-processed supporting member, which may cause contamination of the silicon wafers. Therefore, it is preferable that the gas-discharging-pipe connecting portion 6 is bent, in order for the particles not to fall directly on the substrate-to-be-processed supporting member, even if the particles are generated in the connecting portion of the gas-discharging-pipe connecting portion 6 and the gas-discharging pipe 16.

In addition, as the gas-discharging-pipe connecting portion 6 is bent, radiation heat from the resistance heater 7 that heats the reaction tube 3 doesn't directly reach a flange 17a (see FIG. 9) formed at an end portion of the gas-discharging-pipe connecting portion 6 and the gas-discharging pipe 16. Thus, temperature controls for their members are easy. In that view, preferably, the end portion of the gas-discharging-pipe connecting portion 6 extends nearly to an extension line of the lateral surface of the main body of the reaction tube 3.

As shown in FIG. 9, the flange 17a formed at the end portion of the gas-discharging-pipe connecting portion 6 is closely and hermetically fixed to a flange 17b formed at the gas-discharging pipe 16, via an O-ring 18 made of an elastomer such as a fluorine resin.

A heat-resistant temperature of the O-ring 18 (elastomer) is usually about 300° C. Thus, if the O-ring 18 is heated to a high temperature, the quality of the O-ring 18 may be deteriorated, that is, the sealing performance may be deteriorated. In order to prevent the deterioration of the sealing performance, it is necessary to control a temperature of a portion close to the O-ring 18. In the embodiment, a fluid way 19 for temperature control is formed at the flange 17b, and a fluid for temperature control, such as cooling water, flows through the fluid way 19. Thus, the temperature of the flange 17b is adapted to be controlled suitably. In addition, if a temperature controlling unit 15 like a resistance heater is arranged along a side wall of the flange 17b of the gas-discharging pipe 16, the temperature distribution can be controlled more accurately.

The gas-discharging pipe 16 connected to the end portion of the gas-discharging-pipe connecting portion 6 is connected to a suction unit such as a vacuum pump, not shown. Thus, a vacuum can be created in the reaction tube 3, and the remaining reaction gas, the generated gas and the like can be discharged from the reaction tube 3.

In the embodiment, a temperature controlling unit 15 is also arranged around the gas-discharging pipe 16. Thus, more accurate temperature control can be achieved. An electric heater is preferably used as the temperature controlling unit 15, because the control of the electric heater is easy. It is preferable that the temperature of the gas-discharging pipe 16 is controlled within a range of 150 to 300° C. More preferable temperature of the gas-discharging pipe 16 is 200° C. By means of the above temperature control, even if the exhaust (discharged) gas from the reaction tube 3 passes through the gas-discharging pipe 16, it can be prevented that any impurity film is generated as unnecessary deposit in the gas-discharging pipe 16.

The exhaust gas discharged from the gas-discharging pipe 16 is cooled by a trap, not shown, which is connected to the gas-discharging pipe 16 and has cooling fins or the like. Thus, the exhaust gas (remaining reaction gas, generated gas or the like) discharged from the reaction tube 3 may be solidified and trapped thereby. It is preferable that the trap is arranged between a flange (not shown) at the other end of the gas-discharging pipe 16 and a vacuum pump (not shown) connected to the gas-discharging pipe 16.

As described above, according to the thermal processing unit of the embodiment, the temperatures of the respective members are positively controlled by means of: the temperature controlling unit 15 for controlling the temperature of the gas-discharging-pipe connecting portion 6; the fluid-flowing tunnel for temperature control 19 buried in the flange 17b of the gas-discharging pipe 16; the temperature controlling unit 15 arranged for the side-wall portion of the flange 17b of the gas-discharging pipe 16; and the temperature controlling unit 15 arranged along the gas-discharging pipe 16. Thus, in the vicinities of these members, it can be effectively prevented that an impurity film as unnecessary deposit is generated and that particles are generated from the impurity film.

In the above embodiments of the invention, the silicon wafer is explained as an object to be processed. However, the object to be processed is not limited to the silicon wafer, but may be a LCD substrate or a glass substrate.

The invention claimed is:

1. A thermal processing unit comprising:
a heating-furnace body whose upper end has an opening,
a reaction tube consisting of a single tube contained in the heating-furnace body,
a gas-discharging-unit connecting portion formed at an upper portion of the reaction tube, the gas-discharging-unit connecting portion having a narrow diameter,
a substrate-to-be-processed supporting member for supporting a substrate to be processed, contained in the heating-furnace body, and
a heating unit for heating the substrate to be processed supported by the substrate-to-be-processed supporting member,
wherein the heating unit has:
a first heating portion arranged around the reaction tube,
a second heating portion arranged around the gas-discharging-unit connecting portion,
a third heating portion arranged around an upper portion of the reaction tube,
a fourth heating portion arranged around a lower portion of the reaction tube, and
a fifth heating portion arranged under the substrate-to-be-processed supporting member, wherein
the first heating portion is formed by a plurality of linear heat-generating members, which are arranged in parallel with a longitudinal direction of the reaction tube.

2. A thermal processing unit according to claim 1, wherein the linear heat-generating member is formed by sealing a resistance heater into a hollow tubular member made of ceramics.

3. A thermal processing unit according to claim 2, wherein the ceramics is quartz.

4. A thermal processing unit comprising:
a heating-furnace body whose upper end has an opening,
a reaction tube consisting of a single tube contained in the heating-furnace body,
a gas-discharging-unit connecting portion formed at an upper portion of the reaction tube, the gas-discharging-unit connecting portion having a narrow diameter,
a substrate-to-be-processed supporting member for supporting a substrate to be processed, contained in the heating-furnace body, and
a heating unit for heating the substrate to be processed supported by the substrate-to-be-processed supporting member,
wherein the heating unit has:
a first heating portion arranged around the reaction tube,
a second heating portion arranged around the gas-discharging-unit connecting portion,
a third heating portion arranged around an upper portion of the reaction tube,
a fourth heating portion arranged around a lower portion of the reaction tube, and
a fifth heating portion arranged under the substrate-to-be-processed supporting member, wherein
the first heating portion is formed by a plurality of U-shaped heat-generating members, which are arranged in parallel with a longitudinal direction of the reaction tube.

5. A thermal processing unit comprising:
a heating-furnace body whose upper end has an opening,
a reaction tube consisting of a single tube contained in the heating-furnace body,
a gas-discharging-unit connecting portion formed at an upper portion of the reaction tube, the gas-discharging-unit connecting portion having a narrow diameter,
a substrate-to-be-processed supporting member for supporting a substrate to be processed, contained in the heating-furnace body, and
a heating unit for heating the substrate to be processed supported by the substrate-to-be-processed supporting member,
wherein the heating unit has:
a first heating portion arranged around the reaction tube,
a second heating portion arranged around the gas-discharging-unit connecting portion,
a third heating portion arranged around an upper portion of the reaction tube,
a fourth heating portion arranged around a lower portion of the reaction tube, and
a fifth heating portion arranged under the substrate-to-be-processed supporting member, wherein
the second heating portion is formed by a linear heat-generating member, which is arranged in a spiral pattern.

6. A thermal processing unit comprising:
a heating-furnace body whose upper end has an opening,
a reaction tube consisting of a single tube contained in the heating-furnace body,
a gas-discharging-unit connecting portion formed at an upper portion of the reaction tube, the gas-discharging-unit connecting portion having a narrow diameter,
a substrate-to-be-processed supporting member for supporting a substrate to be processed, contained in the heating-furnace body, and
a heating unit for heating the substrate to be processed supported by the substrate-to-be-processed supporting member,
wherein the heating unit has:
a first heating portion arranged around the reaction tube,
a second heating portion arranged around the gas-discharging-unit connecting portion,
a third heating portion arranged around an upper portion of the reaction tube,
a fourth heating portion arranged around a lower portion of the reaction tube, and
a fifth heating portion arranged under the substrate-to-be-processed supporting member, wherein
the third heating portion is formed by a linear heat-generating member, which is arranged in a spiral pattern.

7. A thermal processing unit comprising:
a heating-furnace body whose upper end has an opening,
a reaction tube consisting of a single tube contained in the heating-furnace body,
a gas-discharging-unit connecting portion formed at an upper portion of the reaction tube, the gas-discharging-unit connecting portion having a narrow diameter,
a substrate-to-be-processed supporting member for supporting a substrate to be processed, contained in the heating-furnace body, and
a heating unit for heating the substrate to be processed supported by the substrate-to-be-processed supporting member,
wherein the heating unit has:
a first heating portion arranged around the reaction tube,
a second heating portion arranged around the gas-discharging-unit connecting portion,
a third heating portion arranged around an upper portion of the reaction tube,
a fourth heating portion arranged around a lower portion of the reaction tube, and
a fifth heating portion arranged under the substrate-to-be-processed supporting member, wherein
the third heating portion is formed by a linear heat-generating member, which is arranged in a switchback pattern.

8. A thermal processing unit comprising:
a heating-furnace body whose upper end has an opening,
a reaction tube consisting of a single tube contained in the heating-furnace body,
a gas-discharging-unit connecting portion formed at an upper portion of the reaction tube, the gas-discharging-unit connecting portion having a narrow diameter,
a substrate-to-be-processed supporting member for supporting a substrate to be processed, contained in the heating-furnace body, and
a heating unit for heating the substrate to be processed supported by the substrate-to-be-processed supporting member,
wherein the heating unit has:
a first heating portion arranged around the reaction tube,
a second heating portion arranged around the gas-discharging-unit connecting portion,
a third heating portion arranged around an upper portion of the reaction tube,
a fourth heating portion arranged around a lower portion of the reaction tube, and
a fifth heating portion arranged under the substrate-to-be-processed supporting member, wherein
the fourth heating portion is formed by a linear heat-generating member, which is arranged in a spiral pattern that is seen as rectangular in a circumferential direction of the reaction tube.

9. A thermal processing unit comprising:
a heating-furnace body whose upper end has an opening,
a reaction tube consisting of a single tube contained in the heating-furnace body,
a gas-discharging-unit connecting portion formed at an upper portion of the reaction tube, the gas-discharging-unit connecting portion having a narrow diameter,
a substrate-to-be-processed supporting member for supporting a substrate to be processed, contained in the heating-furnace body, and
a heating unit for heating the substrate to be processed supported by the substrate-to-be-processed supporting member,
wherein the heating unit has:
a first heating portion arranged around the reaction tube,
a second heating portion arranged around the gas-discharging-unit connecting portion,
a third heating portion arranged around an upper portion of the reaction tube,
a fourth heating portion arranged around a lower portion of the reaction tube, and
a fifth heating portion arranged under the substrate-to-be-processed supporting member, wherein
the fourth heating portion is formed by a linear heat-generating member, which is arranged in a switchback pattern.

10. A thermal processing unit comprising:
a heating-furnace body whose upper end has an opening,
a reaction tube consisting of a single tube contained in the heating-furnace body,
a gas-discharging-unit connecting portion formed at an upper portion of the reaction tube, the gas-discharging-unit connecting portion having a narrow diameter,
a substrate-to-be-processed supporting member for supporting a substrate to be processed, contained in the heating-furnace body, and
a heating unit for heating the substrate to be processed supported by the substrate-to-be-processed supporting member,
wherein the heating unit has:
a first heating portion arranged around the reaction tube,
a second heating portion arranged around the gas-discharging-unit connecting portion,
a third heating portion arranged around an upper portion of the reaction tube,
a fourth heating portion arranged around a lower portion of the reaction tube, and
a fifth heating portion arranged under the substrate-to-be-processed supporting member, wherein
the fifth heating portion is formed by a plate-like heat-generating member.

11. A thermal processing unit according to claim 10, wherein
the plate-like heat-generating member is formed by sealing a resistance heater into a hollow plate-like member made of ceramics.

12. A thermal processing unit comprising:
a heating-furnace body whose upper end has an opening,
a reaction tube consisting of a single tube contained in the heating-furnace body,
a gas-discharging-unit connecting portion formed at an upper portion of the reaction tube, the gas-discharging-unit connecting portion having a narrow diameter,
a substrate-to-be-processed supporting member for supporting a substrate to be processed, contained in the heating-furnace body, and
a heating unit for heating the substrate to be processed supported by the substrate-to-be-processed supporting member,
wherein the heating unit has:
a first heating portion arranged around the reaction tube,
a second heating portion arranged around the gas-discharging-unit connecting portion,
a third heating portion arranged around an upper portion of the reaction tube,
a fourth heating portion arranged around a lower portion of the reaction tube, and
a fifth heating portion arranged under the substrate-to-be-processed supporting member, wherein
the second heating portion is supported in a movable manner in a horizontal direction.

13. A thermal processing unit comprising:
a heating-furnace body whose upper end has an opening,
a reaction tube consisting of a single tube contained in the heating-furnace body,
a gas-discharging-unit connecting portion formed at an upper portion of the reaction tube, the gas-discharging-unit connecting portion having a narrow diameter,
a substrate-to-be-processed supporting member for supporting a substrate to be processed, contained in the heating-furnace body,
a heating unit for heating the substrate to be processed supported by the substrate-to-be-processed supporting member,
a reaction-tube lower lid that seals a lower portion of the reaction tube and holds airtightness in the reaction tube, and
a temperature measuring unit formed by sealing a plurality of temperature measuring members into a hollow tubular member,
wherein the hollow tubular member is arranged in a gap between the heating-furnace body and the reaction tube.

14. A thermal processing unit comprising:
a heating-furnace body whose upper end has an opening,
a reaction tube consisting of a single tube contained in the heating-furnace body,
a gas-discharging-unit connecting portion formed at an upper portion of the reaction tube, the gas-discharging-unit connecting portion having a narrow diameter,
a substrate-to-be-processed supporting member for supporting a substrate to be processed, contained in the heating-furnace body,
a heating unit for heating the substrate to be processed supported by the substrate-to-be-processed supporting member,
a reaction-tube lower lid that seals a lower portion of the reaction tube and holds airtightness in the reaction tube,
a second temperature measuring unit formed by sealing a plurality of temperature measuring members into a second hollow tubular member, and
a third temperature measuring unit formed by sealing a plurality of temperature measuring members into a third hollow tubular member,
wherein at least a portion of the second hollow tubular member extends horizontally from an upper portion of the reaction tube, and
at least a portion of the third hollow tubular member is arranged in a gap between the heating-furnace body and the reaction tube.

15. A thermal processing unit comprising:

a heating-furnace body whose upper end has an opening, a reaction tube consisting of a single tube contained in the heating-furnace body, a gas-discharging-unit connecting portion formed at an upper portion of the reaction tube, the gas-discharging-unit connecting portion having a narrow diameter, a substrate-to-be-processed supporting member for supporting a substrate to be processed, contained in the heating-furnace body, a heating unit for heating the substrate to be processed supported by the substrate-to-be-processed supporting member, a reaction-tube lower lid that seals a lower portion of the reaction tube and holds airtightness in the reaction tube, a second temperature measuring unit formed by sealing a plurality of temperature measuring members into a second hollow tubular member, and a third temperature measuring unit formed by sealing a plurality of temperature measuring members into a third hollow tubular member, wherein the heating unit has:
- a first heating portion arranged around the reaction tube,
- a second heating portion arranged around the gas-discharging-unit connecting portion,
- a third heating portion arranged around an upper portion of the reaction tube,
- a fourth heating portion arranged around a lower portion of the reaction tube, and
- a fifth heating portion arranged under the substrate-to-be-processed supporting member, at least a portion of the second hollow tubular member extends horizontally from an upper portion of the reaction tube, and at least a portion of the third hollow tubular member is arranged in a gap between the heating-furnace body and the reaction tube.

16. A thermal processing unit according to claim 15, wherein a temperature controlling unit is provided around the gas-discharging-unit connecting portion.

17. A thermal processing unit according to claim 16, wherein the temperature controlling unit is a heat-insulating material.

18. A thermal processing unit according to claim 16, wherein the temperature controlling unit is a resistance heater.

19. A thermal processing unit according to claim 18, wherein the temperature controlling unit has flexibility.

20. A thermal processing unit according to claim 18, wherein the temperature controlling unit is shaped in advance.

21. A thermal processing unit according to claim 15, wherein the gas-discharging unit is a gas-discharging pipe whose end portion has a flange, a flange is formed at an end portion of the gas-discharging-unit connecting portion, and the flange at the end portion of the gas-discharging-unit connecting portion and the flange at the end portion of the gas-discharging pipe are hermetically connected to each other by means of a sealing unit.

22. A thermal processing unit according to claim 21, wherein the temperature controlling unit has a fluid hole provided in the flange.

* * * * *